United States Patent [19]

Wagner et al.

[11] Patent Number: 4,990,047
[45] Date of Patent: Feb. 5, 1991

[54] VACUUM APPARATUS

[75] Inventors: Rudolf Wagner, Fontnas, Switzerland; Bader Martin, Balzers, Liechtenstein; Moll Eberhard, Schellenberg, Liechtenstein; Renzo Zanardo, Balzers, Liechtenstein; J. G. Van Agtmaal, Hilversum, Netherlands

[73] Assignee: Balzers Aktiengesellschaft, Balzers, Liechtenstein

[21] Appl. No.: 356,872

[22] Filed: May 24, 1989

[30] Foreign Application Priority Data

May 24, 1988 [CH] Switzerland .......................... 1951/88
Jul. 15, 1988 [CH] Switzerland .......................... 2722/88

[51] Int. Cl.$^5$ ............................................ B65G 49/07
[52] U.S. Cl. .................................... 414/217; 414/226; 414/331
[58] Field of Search ............... 414/217, 225, 226, 416; 432/205, 241

[56] References Cited

U.S. PATENT DOCUMENTS

| | | |
|---|---|---|
| 3,874,525 | 6/1973 | Hassan et al. |
| 4,405,435 | 9/1983 | Tateishi et al. .................. 414/217 X |
| 4,553,069 | 1/1984 | Purser . |
| 4,592,306 | 6/1986 | Gallego ........................... 414/217 X |
| 4,705,951 | 11/1987 | Layman et al. ................... 414/217 X |
| 4,709,655 | 12/1987 | Van Mastrigt . |
| 4,715,637 | 12/1987 | Hosoda et al. ..................... 294/86.4 |
| 4,747,928 | 5/1988 | Takahashi et al. ............. 414/225 X |
| 4,828,224 | 5/1989 | Crabb et al. ..................... 414/217 X |
| 4,874,312 | 10/1989 | Hailey ............................. 432/152 |
| 4,909,695 | 3/1990 | Horwitt et al. ....................... 414/225 |
| 4,917,556 | 4/1990 | Stark et al. .......................... 414/217 |

FOREIGN PATENT DOCUMENTS

0276061 8/1988 European Pat. Off. .
8706561 11/1987 World Int. Prop. O. .......... 414/217

Primary Examiner—Henry A. Bennet
Assistant Examiner—Christopher B. Kitner
Attorney, Agent, or Firm—Notaro & Michalos

[57] ABSTRACT

A vacuum apparatus for treating disk-shaped workpieces includes a central distribution chamber into which the workpieces are brought from a lock through a communication opening which can be closed by a closing member. A transporting mechanism, preferably in the form of a robot arm, is located in the distribution chamber which is adjoined by intermediate chambers distributed along its circumference as exchangeable modules whereby the communication between them can be shut off at each point of connection by a closing member. An intermediate chamber communicates with at least one treatment chamber via an allocated communication opening which, in order to allow a separation of the treatment chamber, is accessible from the intermediate chamber. In the intermediate chamber a further transport mechanism is arranged for taking over the workpieces from the first transport mechanism, which further transport mechanism places the workpieces onto an elevating table located under the treatment chamber. The table forwards the workpiece into the allocated treatment chamber and separates it thereby at the same time from the distribution chamber. Preferably a plurality of treatment chambers are allocated to each intermediate chamber. The closing members at the communication openings between the chambers are controlled during the treatment procedures so that no undesired passing of gases and particles from one treatment station into the other is possible.

22 Claims, 7 Drawing Sheets

VACUUM APPARATUS

BACKGROUND OF THE INVENTION

1. Field of the Invention

The present invention relates to a vacuum apparatus for the treatment of workpieces and having at least one treating chamber for said workpieces and a central evacuable distribution chamber and including a first transporting mechanism and locks through which the workpieces can be placed by the first transporting mechanism into the distribution chamber and retrieved by same after having been treated.

2. Description of the Prior Art

In the periodical Solid State Technology of Oct. 1987 (pages 55/56) such a multi-chamber apparatus for the treating of silicon wafers is known which includes a robot arm located in a central distributing chamber and which places the individual semi-conductor disks in accordance with a set programme into the individual treatment chambers and retrieves these disks out of such chambers after having received a certain treatment such as a coating. A plurality of treatment chambers may be connected to one such central distribution chamber whereby the semi-conductor disks can be transported through the distribution chamber from one treatment chamber into another treatment chamber such that they must not be transported in the free environment between the individual treatments. In case of extremely delicate treatments there is, however, a danger that residual gases which e.g. are necessary for a treatment step in one treatment chamber could reach another treatment chamber where they disturb the treatment being made there or it is possible, that particles which possibly were raised during the one or the other treatment step are dragged along. It is also possible that particles which together with not yet treated semi-conductor wafers are brought from the outer chamber into the distribution chamber and then settle onto already treated semiconductor disks when moving across and detrimentally influence the following treatments to be made with these not as yet treated semi-conductor disks.

It already has been proposed to decouple the individual tretment steps by pressure step locks which are out in the circuit ahead of the treatment chambers e.g. by means of a so called pressure step system which consists of three vacuum chambers which can be evacuated separately and where the wafers are transported through corresponding slots in the walls between the individual chambers into the treatment chambers. The main object of the pressure step locks was thereby only to maintain a differential pressure between the individual chambers of the vacuum system.

SUMMARY OF THE INVENTION

It is an object of the present invention to provide a vacuum apparatus having a plurality of treatment chambers in which the above mentioned dragging along of residual gases and particles from one treatment chamber into the other treatment chamber or one workpiece onto the other, resp. is reduced to a minimum or is excluded entirely.

A further object is to provide a vacuum apparatus which comprises an evacuable intermediate chamber including communication openings and thereto allocated shut-off members located between the distribution chamber and at least one treatment chamber and including communication openings and allocated shut-off members in correlation with the distribution chamber and the treatment chamber and comprising a further transporting mechanism operative to transport the workpieces into the treatment chamber.

Yet a further object is to provide a vacuum apparatus in which a plurality of intermediate chambers and thereto allocated treatment chambers are connected to one distribution chamber and/or a plurality of treatment chambers are allocated to one intermediate chamber.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
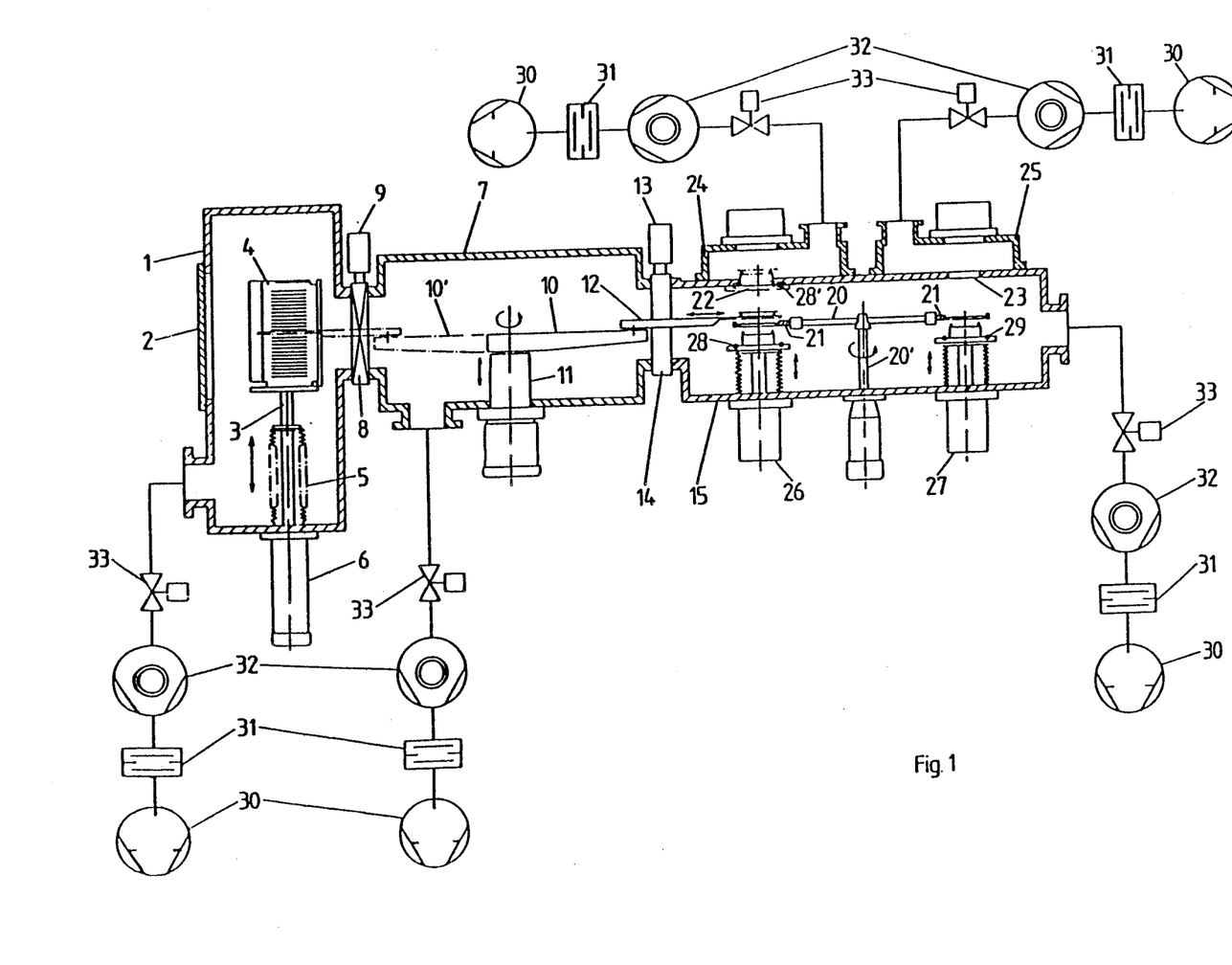
FIG. 1 is a schematic view of a vertical section through a vacuum apparatus.

FIG. 1 illustrates a lock chamber 1 forming an input chamber and having a door 2 leading to the free environment and having a mounting support 3 for a wafer magazine 4 located in said chamber 1. The magazine 4 can be raised and lowered by means of an elevating mechanism having a siphon gland 5 and an operating mechanism 6 such that at a given instance one certain disk of the magazine 4 to be treated is located at a suitable height or level for introduction into a distributing chamber 7 through a opening of the gate 8; latter is opened or closed as the need arises by an actuator unit 9.

A first transport mechanism 10, 11 for a transporting of the respective disk retrieved from the magazine on to the intermediate chamber 15 is located in the distributing mechanism includes a rotatably mounted robot arm 10 to which a controllable drive 11 is allocated. In operation the robot arm 10 retrieves by means of the disk support 12 and by the gate 8 in its open position one respective disk from the magazine 4 and forwards the disk through the open gate 14 which is operated by an auxiliary unit 13 into the intermediate chamber 15. In case of a plurality of intermediate chambers the disk is forwarded into such intermediate chamber which corresponds to the treatment operating programme.

The position of the rotatable robot arm 10 in which it retrieves a disk from the magazine 4 is illustrated in FIG. 1 by broken lines 10. Its position in which it passes the disk on to the intermediate chamber 15 whereby the gate 14 is open is identified by 10 in full lines. A second mechanism for the handling of the disks is located in the intermediate chamber 15 from which the forwarding of the disks to the individual treatment chambers 24 and 25 connected thereto is made, in which chambers the disks are subjected to their further treatment steps, e.g. a coating or etching during a treatment procedure of the production.

This second transport mechanism is designed similar to the first one as a rotating arm 20 having gripping devices 21 for a taking over of the disks brought by the first mechanism. By means of a corresponding rotating of the gripping devices 21 along a circular path the disks can be brought under the openings 22 and 23 located on a circle to the treatment chambers 24 and 25 and can be raised by means of elevating mechanisms 26 and 27 (which can be designed similar to those in the lock chamber 1) upto the treatment locations of the individual treatment chambers and lowered, after the treatment and be forwarded to a further treatment station. The elevating mechanisms of the illustrated embodiment are additionally equipped with annular seals 28 and 29 which upon getting fitted at the cover of the intermediate chambers provide for a vacuum tight seal around the openings 22 and 23 and between the intermediate chamber and the treatment chambers; the shut off position of the seal 28 is illustrated in FIG. 1 by 28'.

FIG. 1 illustrates further schematically the pumping units allocated to the various chambers and of which each can consist e.g. of a backing pump 30, a condenser 31, a high vacuum pump 32 and a valve 33. All gates and valves and the pumps can be connected to a control mechanism or control computer, so as to actuate them for the desired treating or production cycle (which is not a subject of the present invention).

In FIG. 1 only one simplyfied arrangement having only one intermediate chamber 15 connected to the chamber 7 is shown, it is, however, obvious for the person skilled in the art that also two or more intermediate chambers can be connected to the distribution chamber from which the disks can be distributed in accordance with a pre-set programme by the second mechanism to the treatment chambers connected to the intermediate chambers.

Figure 2:
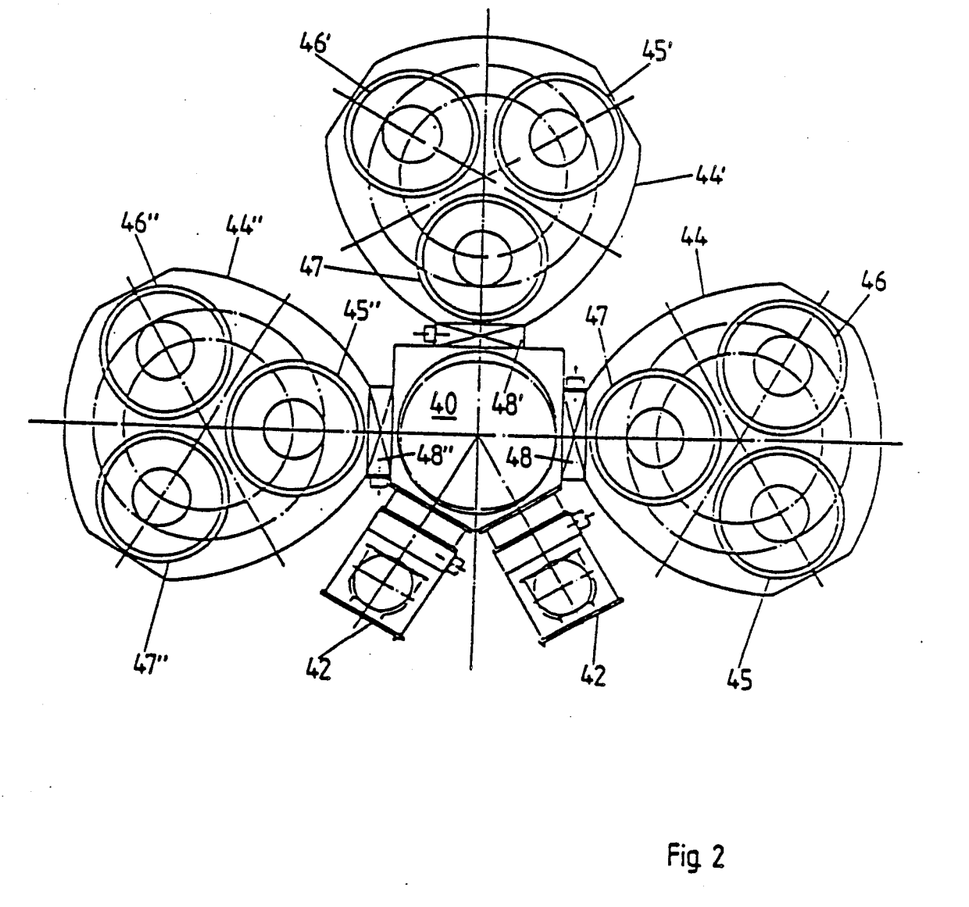
FIG. 2 is a schematic top view of a vacuum apparatus having three intermediate chambers and nine treatment chambers.

The pattern of such an arrangement is illustrated in FIG. 2. The reference numeral 40 denotes the central distributing chamber having at least three parts and into which the disks to be treated are fed and from which they are retrieved after the treatment from and to workpiece input and output chambers 42, 42. The intermediate chambers 44, 44' and 44" are connected at three sides and at three ports to this central distributing chamber and in the illustrated embodiment three treatment chambers are connected to every intermediate chamber, which treatment chambers are identified in FIG. 2 schematically by 45, 46 and 47; 45', 46' 47' and 45", 46", 47". The communication between the distributing chamber and the intermediate chambers connected thereto is given by the gates 48, 48' and 48", which are opened and closed by an actuating unit in accordance with the processing treatments to be made. The above mentioned (not illustrated in FIG. 2) first and second mechanisms are located in the central distributing chamber or in the intermediate chambers which are flanged thereto; these conduit the transporting of the disks in accordance with the processing sequence into the individual chambers or out of these chambers, similar to the procedure described in connection with FIG. 1.

Figure 3:
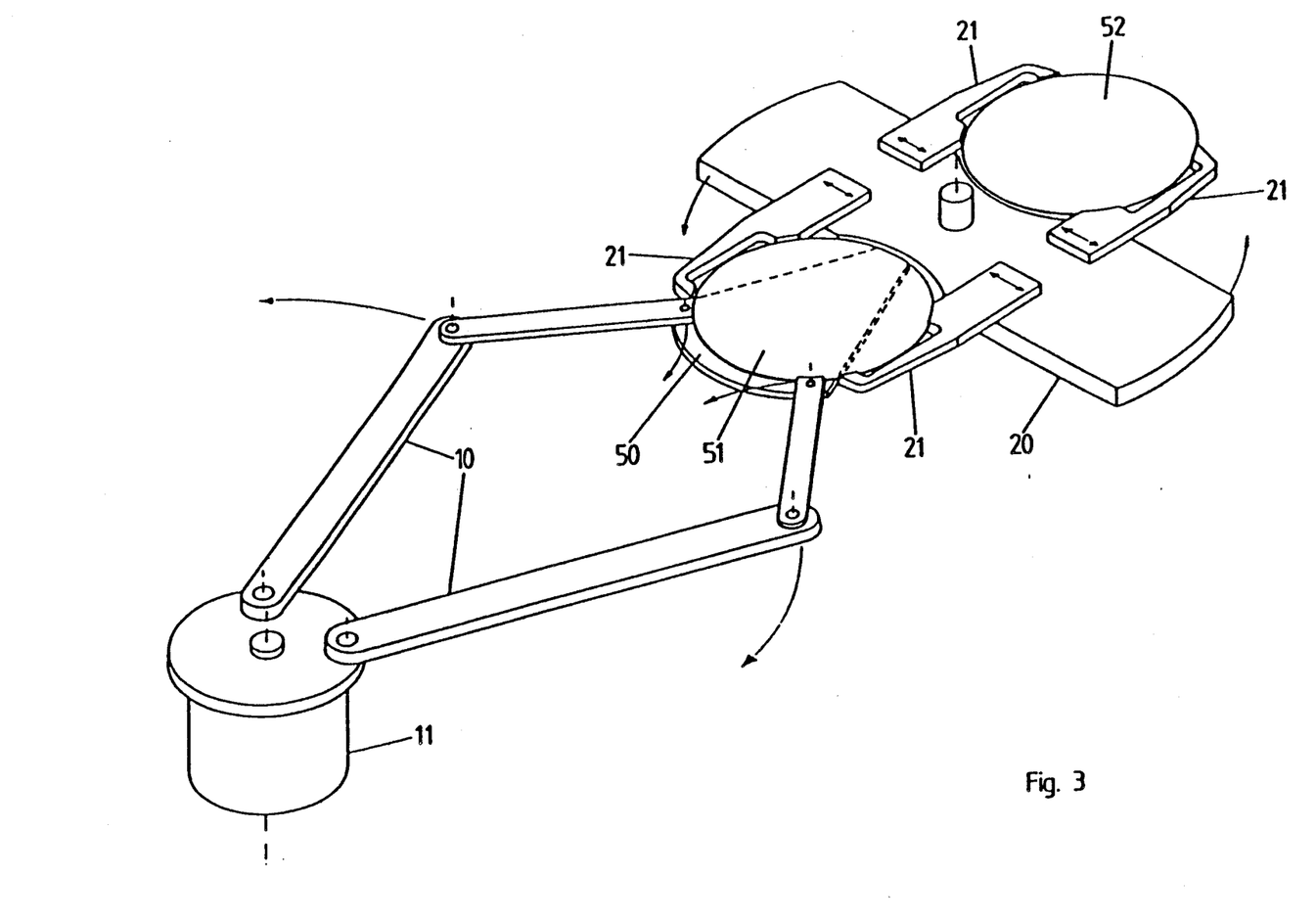
FIG. 3 is a perspective illustration of the principle of the transferring of a disk from the first to the second transporting mechanism.

FIG. 3 illustrates the first and second mechanisms used in the embodiment of FIG. 1 and the interaction. The reference numerals, as far as used, are the same as those of FIG. 1. A plate 50 is mounted to the robot arm 10 and controlled by the drive 11, so that the plate can reach under a disk and take it from the cassette in the lock chamber 1 and pass it on after a retreating and rotating of the robot arm from the position 10' into the position 10 (see FIG. 1) to the gripping devices 21 in the chamber 15. By means of the second mechanism the disks will thereafter be brought into the proper position opposite the opening of a treatment chamber in that it rotates around the axis 20'. The apparatus according to FIG. 1 is designed such that the corresponding disk is positioned already after the passing on to the second mechanism in this position opposite of the treatment chamber 24. In the illustration according to FIG. 3 a disk 51 located on the plate is just passed on to the gripping device 21 (and thus would be positioned under the opening 22 of FIG. 1), whereas a further disk 52 is illustrated under the opening 23 of the treatment chamber 25 rotated further (in case of a treble division rotated further by 120°).

The inventive method for operating the vacuum apparatus will now be explained based on FIG. 1 and is characterized in that the first transporting mechanism 10, 11, 12 located in the first distributing chamber 7 takes consecutively one workpiece out of a magazine 4 in the lock 1 and transports it along the course through the distributing chamber 7 into an intermediate chamber 15 and in that the second transporting mechanism 20, 21 located in the intermediate chamber takes the workpiece over from the first transporting mechanism 10, 11, 12 and keeps it ready in a position coaxial to a communication opening 22 or 23 between the intermediate chamber 15 and one of the treatment chambers 24 or 25. This method of operation is specifically characterized in case of a plurality of treatment chambers 24, 25 allocated to one intermediate chamber 15 and of elevating mechanisms 26, 27 for a raising and lowering transport of the disks into and out of the treatment chambers in which elevating mechanisms 26, 27 are located below the communication openings 22, 23 between the treatment chambers 24, 25 and the intermediate chamber 15 and in the intermediate chamber 15, in accordance with the invention in that the second transport mechanism 20, 21 places the workpiece which has been taken over from the first transport mechanism 10, 11, 12 onto one of the elevating mechanisms 26, 27 which transports the workpiece into a treatment chamber 24, 25 located above the elevating mechanisms 24, 25, and in that the workpiece is transported along the same path at a reversed sequence of the transporting steps back to its starting position.

The method of operating the vacuum apparatus can specifically be formed such that in case of at least two treatment chambers 24, 25 allocated to one respective intermediate chamber 15 each one of these treatment chambers is placed into operation and regenerated during consecutively following time intervals alternatively after being loaded, whereby during the regeneration of one treatment chamber the further chamber is placed into operation. In other words it can be stated that for each treatment chamber a certain time span during which a disk is treated in this chamber is followed by a time span during which this chamber is regenerated. In case of two treatment chambers being present such can be carried out alternatively such that the regenerating phase and the treatment phase are interchanged continuously.

In case of a plurality of treatment chambers 24, 25 and in view of increasing the throughput, it is of course possible to carry out parallel treatments (parallel processes).

Finally, the method of operating the vacuum apparatus can be designed in accordance with the invention also such that instead of an elevating mechanism 26 or 27 a magazine having a supply of disks is located in an intermediate chamber and that then an intermediate chamber with a plurality for instance three treatment chambers allocated thereto is put into operation as a unit which is functionable independently from the rest of the vacuum apparatus, in other words a unit which can operate autonomously if for instance the other parts of the vacuum apparatus are out of operation due to an operational break-down.

It already has been mentioned above that the vacuum apparatus comprises elevating mechanisms located in every intermediate chamber present, which are operative to bring a disk placed onto the elevating mechanism into a treatment chamber located above the intermediate chamber. During this procedure the disk shaped workpiece must be secured to the support of the elevating mechanism, i.e. the workpiece must be held at its edge such that it maintains a predetermined position.

It is known to use, in order to arrest the workpiece, for instance having the shape of a disk, gripper-like leaf springs which grip around the edge of the disk. These arresting units can be operated into an open and into a closed condition in which they keep the disk arrested. This gives, however, rise to the difficulty that these arresting devices in the treatment chamber are also exposed to the treatment made at the disk. Such treatment is for instance a coating of 1μ aluminum for each disk at a through-put of one disk per minute. As a consequence within five days an aluminum coating of more than 7 millimeters thickness will grow on these arresting or holding devices. It is possible that lumps of aluminum are produced which can hang over and lead often to undesirable shadings during a coating of a disk. It also may happen that the disks grow together with such holding devices and adhere to these devices. If the treatment, on the other hand is an etching process the holding devices are etched too and the material which is removed from the disks could thereby soil the surface of the disk. During a cleaning etching of the disk by a cathode atomization the holding devices cause also distortions of the potential and as a consequence thereof often a kind of a halo or shade.

In many cases the disk to be treated should be positioned on the support of the elevating mechanism further at a predetermined orientation of its position before the disk is transported into the treatment chamber. For the treatment of semiconductor disks for the production of integrated micro-electronic blocks the disk has for instance a contour which differs from the shape of a circle whereby a segment of the circle is cut off which serves for an indicating of the orientation of the crystals and the support for the disk has the same contour which differs from the shape of a circle and the disk must be held and transported precisely oriented relative to the support.

For the vacuum apparatus of the kind mentioned above an elevating mechanism is thus necessary in the shape of a specific elevating table with holding devices which are in a position to bring the workpiece onto the support in an exactly oriented position and lock the workpiece during its transport and without they themselves being exposed during the treatment of the workpiece to the influence of this treatment.

The elevating table to be used in the vacuum apparatus should, furthermore enable a treatment of the workpiece in the treatment chamber at predetermined set temperatures which must be held precisely constant. To this end a supplying of heat against the lower surface of the workpiece or a cooling thereof may be needed.

In order to solve the first object of a position oriented placing of the workpiece onto a support and of a securing of the transport into the treatment chamber an elevating table serves for the rising and lowering transport of a disk shaped workpiece which has a movable workpiece support at which holding members are arranged pivotably to pivot into a holding position and out of holding position, such to move them shortly before the movable support reaches a treatment position into the release position and to move them in this position during the rest of the transport movement of the support into the treatment station until it moves behind a cover which protects the holding devices from the influences of the treatment of the workpiece.

In order to solve this further object the workpiece support is provided with a heating plate which is heatable by a heating element and with a plurality of channels opening at the surface of the support and which are jointly connected to a gas supply line in order to generate between support and workpiece a gas cushion as a homogenous heat conducting means for a heating of the workpiece. The gas cushion serves for an absolutely equal heat distribution under the workpiece. In order to prevent the workpiece from lifting off due to the gas cushion a dead weight load in the form of a loose ring is used which comes to lie at the outer edge of the workpiece in the treatment station. This ring has, furthermore, the duty to keep the annular gap between the support which carries the workpiece and the cover closed. To this end it is also possible to obviously use also a ring which rests only on the edge of the support but not on the edge of the workpiece such that the latter can also be transported in a freely resting condition. By means of this, it is possible to treat with the same apparatus either a freely resting workpiece or a workpiece secured at its edge, depending on the prevailing kind of necessary treatment. The ring rests preferably along the entire edge of the workpiece if a sealing action for the gas cushion is to be reached between the workpiece and the support. In this case the ring can be mounted by a spring bellows gas tight to the housing of the vacuum apparatus whereby also the elastic action of the spring bellows can be utilized to counteract the pressure of the gas cushion. If, however, the workpiece must be treated upto the outermost edge the ring can rest also by hooks located at its inner edge on the edge of the workpiece such that, except for the areas of the hooks, the largest part of the edge of the workpiece is heated.

The elevating table with the holding members which can be pivoted into a holding condition and out of the holding condition has the advantage that the holding members protected in the position away from the holding position behind the cover can not get bonded or attached, to the workpiece by the influences of the treatment. If, however, the workpiece gets bonded to the ring resting on the edge of the workpiece the pivotable holding members operate in their position pivoted inwards toward the workpiece to separate during the reverse movement of the elevating table into its starting position, the workpiece by tearing the ring off.

Figure 4:
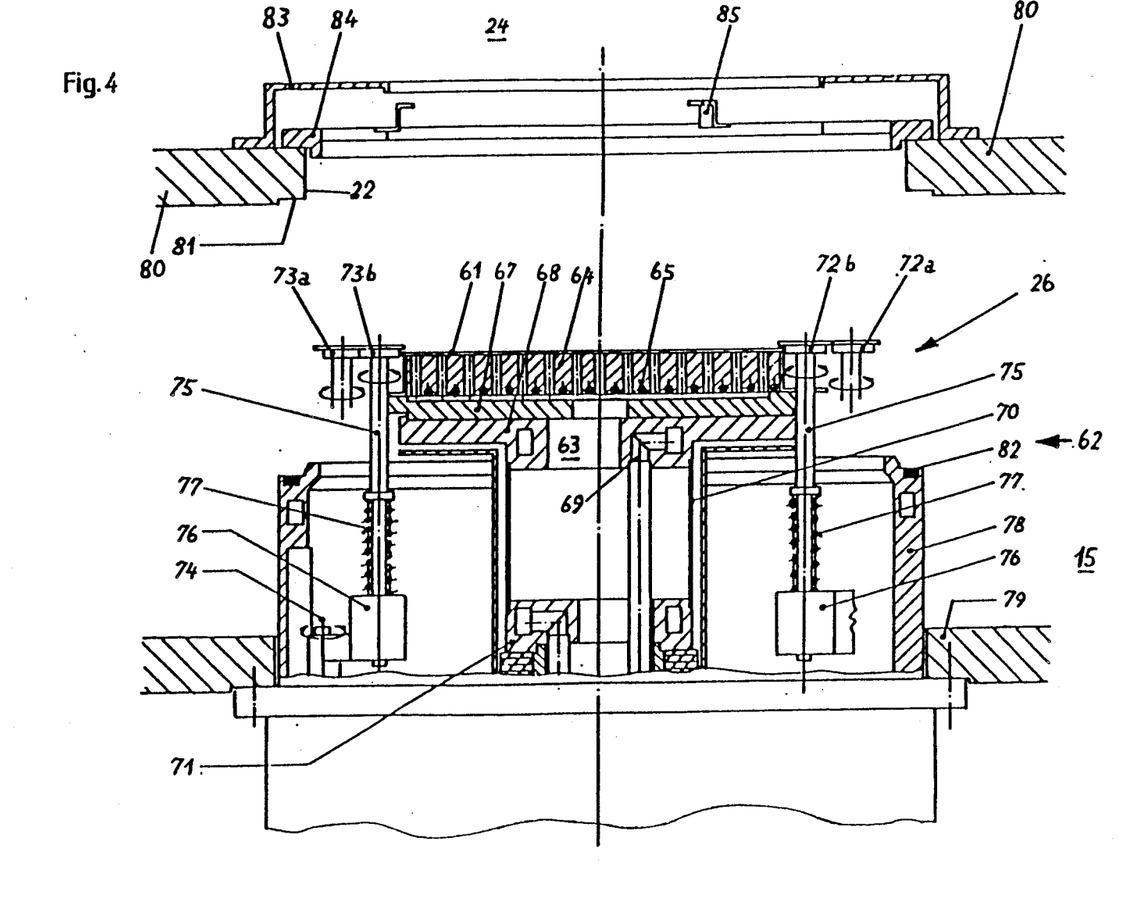
FIG. 4 is a schematic view of a vertical section through an elevating table located in an intermediate chamber and including a mounting device for the disk, illustrated in a first elevating position.

FIG. 4 illustrates the most important parts of one of the elevating mechanisms 26 and 27 illustrated in FIG. 1 and which are designed respectively as elevating table for a rising and lowering movement of a workpiece inside of an intermediate chamber 15. The elevating table 26 is illustrated in FIG. 4 in the so-called loading position in which a disk shaped workpiece 61 is placed on a workpiece support 62 consisting of several parts and specifically onto the central part 63 which in the illustrated example is provided with a heating plate 64 which is heated by a heating element and which heating plate has a plurality of vertical through bores through which a gas can flow inbetween the disk shaped workpiece 61 and the upper surface of the heating plate 64. The heating element can heat the heating plate up to a temperatures over 500° C. and the heated gas acts then as heat conducting medium in order to completely evenly heat the workpiece over its entire surface. Use is made here preferably of the same gas which is used by a treatment made in the vacuum apparatus because a gas tight seal at the edge of the heating plate can be achieved only with large difficulties.

A flange 67 located under the heating plate 64 is used for the mounting of the heating element 65 and for the gas supply to the through bores in the heating plate. This heating plate and the flange 67 are mounted together onto a further flange 68 which contains channels 69 of a rapid cooling system. The flange 68 is mounted gas tight by means of a thin walled tube 70 in a temperature insulated fashion to an also cooled and electrically insulated mounted part 71.

Figure 7:
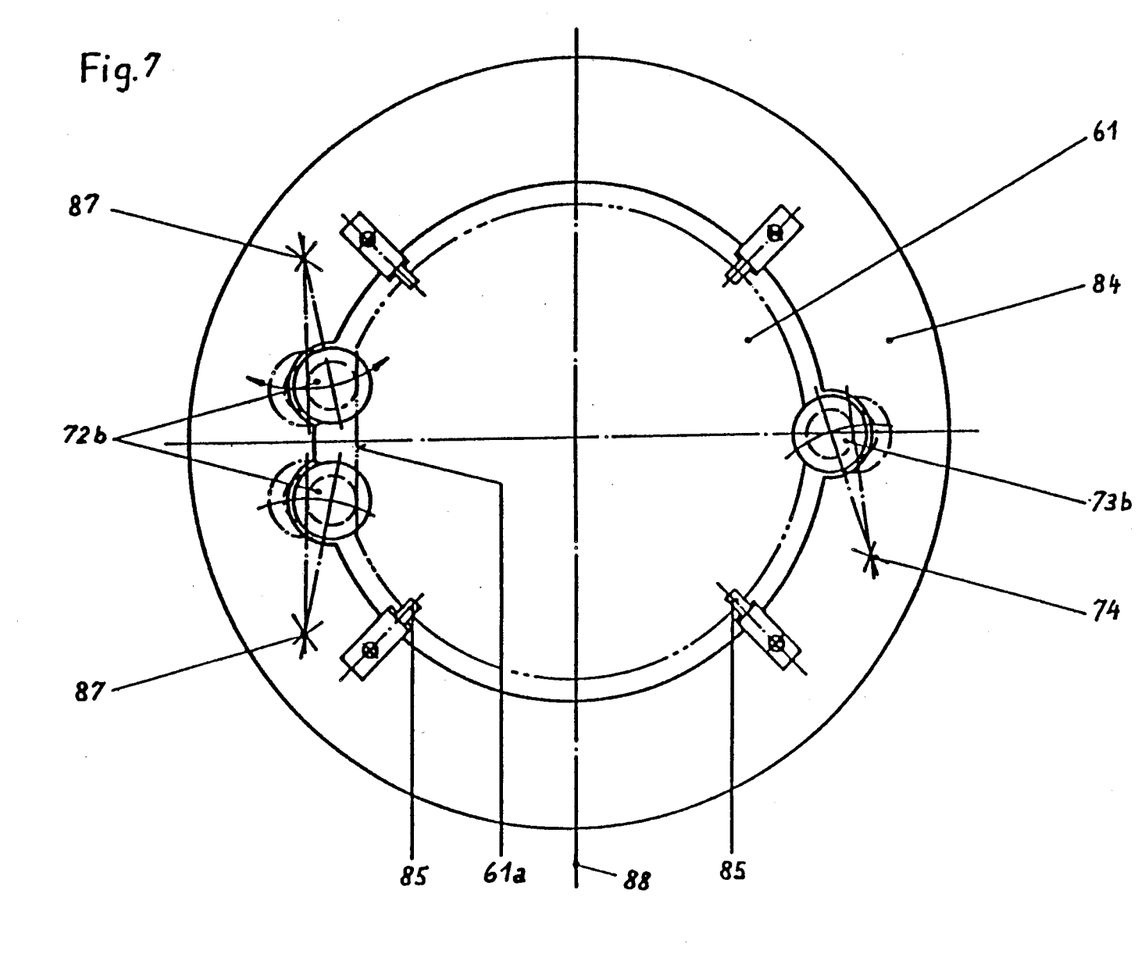
FIG. 7 is a top view of structural members belonging to the elevating table.

The workpiece support 62 which can be moved upwards and downwards includes also mounting members 72 and 73 mounted pivotably thereto. FIG. 7 discloses that two of such mounting members 72 are present at the one side and one mounting member 73 is present at the opposite side. After the workpiece has been placed onto the support 62 the mounting members are pivoted from a position 72a and 73a, in which position they are remote from an workpiece engaging position into the position 72b and 73b in which position they are in a engaging position. To this end they are pivoted around an axis 74 extending parallel to the center axis of the workpiece support 62. If necessary a correction of the position of the workpiece 62 its support is made during this movement, which will be explained in detail later on based on FIG. 7. The mounting members 72 and 73 consist each of a rod shaped body 75 which is supported in a bearing 76 for rotation around its axis. Each mounting member can be pressed downwards against the action of a pressure spring 77 supported on the bearing and surrounding the rod shaped body 75.

A cylindrically shaped outer member 78 belongs also to the workpiece support 62 which can be moved upwards and downwards and within which the mounting members 72 and 73 are arranged for a pivotal movement. Such as is disclosed in FIG. 1 the elevating table 26 extends from below through a recess in the wall 79 of the intermediate chamber 15 and this elevating table is flanged at the lower side onto this wall 79. According to FIGS. 1 and 4 a treatment chamber 24 is located above the intermediate chamber 15 which two chambers communicate via a communicating opening 22 in the wall 80 located therebetween. Against an area formed at this wall 80 at the edge of the opening 22 and shaped as valve seat 81 the upper edge of the cylinder shaped outer member 78 with a seal 82 is moved into a sealed contact when the elevating table 26 has risen in order to treat a workpiece 61 inside of the treatment chamber 24. The elevating table 26 acts, therefore, not only for a rising and lowering transport of the workpieces but forms at the same instance a seal which separates the intermediate chamber 15 from the process chamber in a gas tight manner.

According to FIG. 4 an annular cover 83 is mounted to the wall 80 of the chamber and inside of the treatment chamber. Under this cover a loose ring 84 rests on the edge of the wall of the chamber and is guided in the opening 22. At its inner edge this ring 84 has hooks 85 distributed along its circumference.

Figure 5:
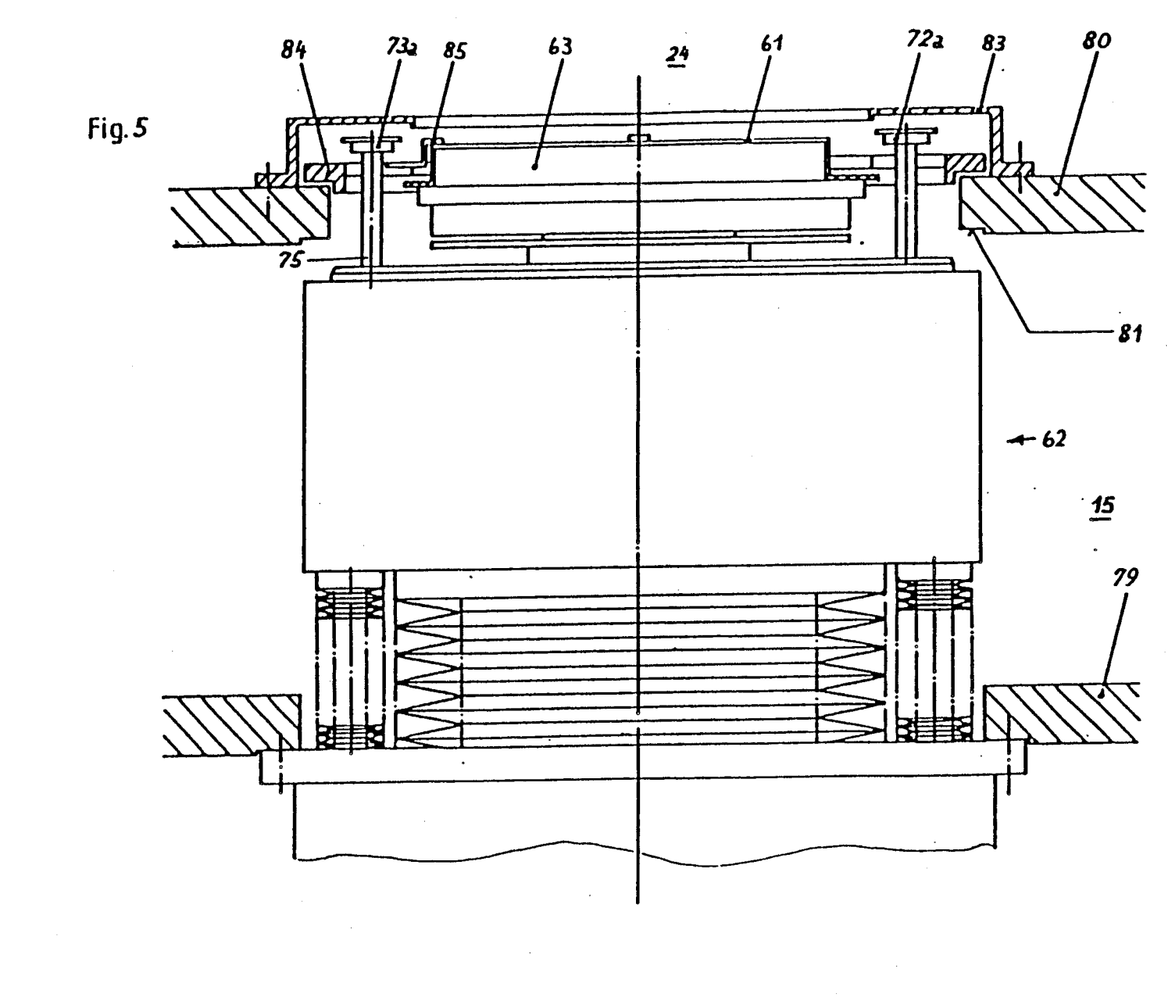
FIG. 5 illustrates the elevating table of FIG. 4 in an intermediate position.

In FIG. 5 the workpiece support 62 is illustrated in a position risen into an intermediate station. Thereby the workpiece 61 resting on the support has lifted somewhat and the ring hangs by means of its hooks 85 on the edge of the workpiece such that latter is pressed against the heating plate 64 and is secured against a lateral sliding away. The ring acts thereby also as a dead weight loading in order to act against the earlier mentioned gas cushion between the workpiece and the heating plate. This ring 84 has the further duty of covering the annular gap present between the cover 83 and the workpiece which has been risen on the support in order to protect the parts located thereunder from the influence of the treatment taking place in the treatment chamber. In FIG. 5 the mounting members 72 and 73 are illustrated in a position remote from the mounting position, i.e. pivoted toward the outside.

Figure 6:
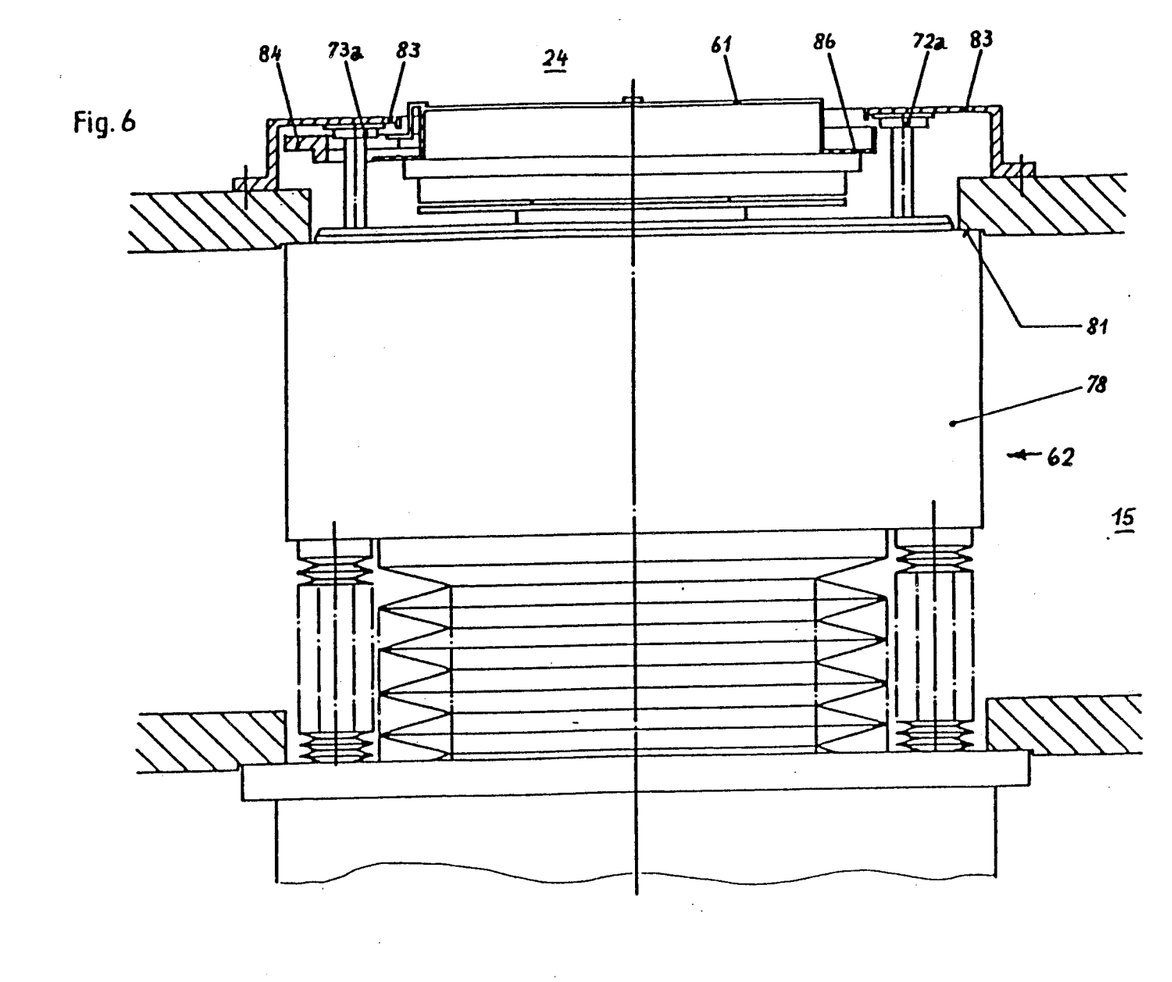
FIG. 6 illustrates the elevating table of FIG. 4 in its final position during the treating of the disk in the treatment chamber.

The workpiece support 62 is illustrated in FIG. 6 risen up into its end position and is located at the treatment position. This position is reached when the cylindrical outer member 78 of the support 62 has been moved onto the edge of the wall 15 of the chamber 80 which is shaped as valve seal 81. The workpiece 61 projects then over the cover 83 and is fully exposed to the treatment in the treatment chamber 24. The mounting members 72 and 73 are pressed at the lower side against the cover 83 where they are slid inwards against the action of the spring 77. In this position under the cover 83 these mounting members 72 and 73 are protected from the influences of the treatment of the workpieces.

In FIG. 6 different embodiments are illustrated at the right hand side and the left hand side and the movable ring 84 is only visible at the left hand side. A annular shield 86 is illustrated in the right hand side of this figure which shield 86 is mounted to the support 62 and covers the annular gap between the cover 83 and the workpiece in order to protect the part located there below from the influences of the treatment chamber. This shield in the shape of a groove must receive during coating treatments the coatings which grow slowly, e.g. an aluminum layer which can be as thick a 7 millimeters. Such coatings can also grow on the cover 83 for which reason this cover is easyly exchangeable and accessible from the treatment chamber 24, which is also true for the loose ring 84 and the shield 86. The right hand side of FIG. 6 illustrates a possible embodiment having only one workpiece supporting plate, i.e. without a heating plate.

FIG. 7 illustrates a top view of the loose ring 84 with the hooks 85 located at its inner edge as well as the mounting members 72 and 73 for acting together with the disk shaped workpiece 61 illustrated with broken lines. In other words, the direction of view originates at the treatemnt chamber 24 when the cover 83 is removed. FIG. 7 illustrates the position after the workpiece support 62 has reached the intermediate position according to FIG. 5 but before the pivoting movement of the mounting members 72 and 73 towards the outside. In other words, the illustration according to FIG. 7 is identical to the situation of the loading position according to FIG. 4 after the mounting members have been pivoted toward the inside if one imagines the loose ring 84 of FIG. 4 to lie in a plane above the workpiece 61 and the mounting members. The two situations mentioned before repeat themselves during the transporting of the workpiece from the treating position back into the loading position. Twice during every treatment cycle with a to and from transport, namely always during the pivoting movement of the mounting members 72 and 73 towards the inside into the position in accordance with FIG. 7 the orientation of the workpiece is corrected. Thereby, the two mounting members 72 are pivotted initially around axes 87 extending parallel to the center axis and not particularly illustrated in FIG. 4 and pressed firmly against a mechanical abutment. The mounting member 73 is thereafter pivoted inwards around the axis 74 also illustrated in FIG. 4. The mounting member presses the workpiece 61 with the edge of the segment 61a (or the flat) softly against the two mounting members 72 and corrects thereby the orientation of the workpieces if the mounting members 72 are not contacted at the same time by the segment edge 61a, i.e. if the mounting members 72 and this edge 61a have not been oriented beforehand parallel. A shifting of the workpiece in the direction against the axis 88 during the procedure of correcting the orientation can be limited in both positions, namely in the loading position by the here not described means for transporting the workpiece from one to the other station and in the intermediate station by the loose ring 84 or parts mounted thereto.

While there is shown and illustrated a present preferred embodiment of the invention it is to be distinctly understood that the invention is not limited thereto, but may be otherwise variously embodied and practiced within the scope of the claims.

I claim:

1. A vacuum apparatus for the treatment of workpieces, comprising:
    at least one distribution chamber with at least three ports, said ports being shutable with respective vacuum-tight shut-off members;
    pumping means connected to said distribution chamber for evacuating at least said distribution chamber;
    at least one intermediate chamber with at least three ports;
    pumping means connected to said intermediate chamber for evacuating at least said intermediate chamber;
    at least two treatment chambers each having a port, said at least two treatment chambers being connected at their ports to two respective ports of said intermediate chamber, said intermediate chamber having a remaining port;
    said distribution chamber being connected at one of its ports to the remaining port of said intermediate chamber, said distribution chamber having two remaining ports;
    said two remaining ports of said distribution chamber being connected to respective ports of at least two of the group including: a workpiece input chamber having a port; a workpiece output chamber having a port; a workpiece input and output chamber having a port; a treatment chamber having a port; a further distribution chamber having at least three ports, and a further intermediate chamber having at least three ports;
    first transport means within said at least one distribution chamber for transporting workpieces to and from said at least three ports of said distribution chamber; and
    second transport means within said at least one intermediate chamber for transporting workpieces to and from said at least three ports of said intermediate chamber.

2. The vacuum apparatus of claim 1, comprising at least one further intermediate chamber each with at least two treatment chambers, said at least one further intermediate chamber being connected to said distribution chamber.

3. The vacuum apparatus of claim 1, in which said first transport means comprises a robot arm arranged rotatably in said distribution chamber.

4. The vacuum apparatus of claim 1, in which said second transport means comprises a supporting structure which is rotatable around a vertical axis.

5. The vacuum apparatus of claim 4, in which said treatment chambers are located axially above said structure connectable therewith for passage by selectively closable openings located above a circular path said rotatable supporting structure.

6. The vacuum apparatus of claim 5, including elevating mechanisms operative to lift said workpieces into and out of said treatment chambers, located below a circuit path of said supporting structure and aligned with said ports of said treatment chambers.

7. The vacuum apparatus of claim 1, comprising a control unit connected to shut-off members and operating so that a simultaneous spatial communication between said treatment chambers is impossible during a treatment operation.

8. The vacuum apparatus of claim 5, wherein said ports of said treatment chambers are arranged in a circle around said axis.

9. The vacuum apparatus of claim 5, including means for selectively closing the ports of said treatment chambers.

10. The vacuum apparatus of claim 2, including shut-off members for each port of said treatment chambers, and a control unit connected to said shut-off members for moving said shut-off members to open and close the ports of said treatment chambers.

11. The vacuum apparatus of claim 1, wherein said at least three ports of said distribution chamber lie in a common plane around said distribution chamber, said first transport means including a robot arm mounted for rotation about an axis extending perpendicularly to the common plane for transporting workpieces to and from each of the at least three ports of said distribution chamber, the two ports of said intermediate chamber which are connected to the two ports of said at least two treatment chambers, lying in a plane parallel to said common plane, said second transport means comprising a carrier mounted for rotation in said intermediate chamber about an axis extending perpendicularly to said common plane, and handling means connected to at least one of said carrier and said robot arm for transferring a workpiece between said robot arm and said carrier.

12. The vacuum apparatus of claim 11, wherein said second transport means includes elevator means under said carrier for lifting a workpiece from said carrier to one of said two ports to which said ports of said treatment chambers are connected, said elevator means, and said one of said two ports being aligned in a direction perpendicular to said common plane.

13. The vacuum apparatus of claim 1 wherein said shut-off members each comprise controllable valve means for opening and closing said ports.

14. The vacuum apparatus of claim 1, wherein at least one of said treatment chambers is connected at its port by a controllable shut-off members to said intermediate chamber.

15. The vacuum apparatus of claim 11, wherein said carrier comprises at least two depositing areas on which workpieces can be deposited by said handling means.

16. The vacuum apparatus according to claim 11, wherein said carrier comprises at least one depositing area on which a workpiece may be deposited by said handling means, and an indexing drive connected to said carrier for moving said depositing area into alignment with each of said treatment chamber ports.

17. The vacuum apparatus of claim 16, wherein said second transport means comprises at least one elevator means movable parallel to said axis of said carrier, said elevator means being aligned with one of said ports, said carrier comprising at least one depositing area for receiving a workpiece thereon by said handling means, said depositing area being rotatable by said carrier into alignment with said elevator means and said one port, said elevator means being movable through said aligned depositing area to said one port.

18. The vacuum apparatus of claim 17, wherein said elevator means comprises sealing means for sealing said one port when a workpiece is moved by said elevator means through said one port into the treatment chamber of said one port.

19. The vacuum apparatus of claim 17, wherein said elevator means comprises a support surface for carrying a workpiece during treatment of the workpiece in the treatment chamber of said one port.

20. The vacuum apparatus of claim 19, wherein said support surface comprises means for controlling a treatment process for the workpiece in said treatment chamber of said one support.

21. A vacuum apparatus for the treatment of workpieces, comprising:
an intermediate chamber with at least three ports, at least a first one of said ports being positioned in a periphery of said intermediate chamber and at least a second and third one of said ports being positioned in an end wall of said intermediate chamber;
workpiece supplying and receiving means connected to said at least one first port for supplying and receiving workpieces through said first port in a direction parallel to a plane of said end wall;
a treatment chamber connected to each of said second and third ports for treating a workpiece supplied through each of said second and third ports;
first conveying means mounted for rotation about an axis perpendicular to said plane for moving a workpiece into a plurality of locations in said intermediate chamber, at least a part of said locations being respectively aligned in a direction parallel to said axis, with one of said second and third ports; and
second conveying means aligned with each of said part of said locations for linearly moving a workpiece at each of said part of said locations from said first and second conveying means into one of said second and third ports, said first and second conveying means being structured to avoid any interaction between said first conveying means and said second conveying means when said second conveying means linearly move a workpiece into one of said second and third ports.

22. A vacuum apparatus according to claim 21 wherein said end wall comprises an upper wall of said intermediate chamber, said second conveying means comprising elevator means for elevating a workpiece from said first conveying means to one of said second and third ports.

* * * * *